United States Patent [19]

Drinkard, Jr.

[11] 4,212,102
[45] Jul. 15, 1980

[54] IC SOCKET INSERTION TOOL
[75] Inventor: John H. Drinkard, Jr., Exton, Pa.
[73] Assignee: Burroughs Corporation, Detroit, Mich.
[21] Appl. No.: 963,116
[22] Filed: Nov. 22, 1978
[51] Int. Cl.² ............................................. H05K 3/30
[52] U.S. Cl. ...................................... 29/741; 29/759; 29/837
[58] Field of Search ................. 29/739, 740, 741, 757, 29/759, 626

[56] References Cited
U.S. PATENT DOCUMENTS

| | | |
|---|---|---|
| 3,963,456 | 6/1976 | Tsuchuja et al. ....................... 29/739 |
| 4,102,043 | 7/1978 | Andrade et al. ........................ 29/739 |
| 4,142,286 | 3/1979 | Knuth et al. ............................ 29/626 |

Primary Examiner—Carl E. Hall
Attorney, Agent, or Firm—Mark T. Starr

[57] ABSTRACT

An apparatus for use in installing integrated circuit sockets on printed circuit boards. A frame, on which is mounted dispenser tubes loaded with integrated circuit sockets, is positioned at an acute angle and vibrated at low frequency, causing the integrated circuit sockets to slide down the dispenser tubes. A template, containing cavities to receive the integrated circuit sockets, is slidably mounted at the lower end of the dispenser tubes. As the integrated circuit sockets are discharged from the dispenser tubes, they fall into the cavities, pin side up. A printed circuit board is aligned above the loaded template and the two are clamped together causing the integrated circuit socket pins to pass through corresponding holes in the printed circuit board. The clamped printed circuit board and template are then rotated 180 degrees and the template is removed, leaving the integrated circuit sockets mounted on the printed circuit board.

13 Claims, 4 Drawing Figures

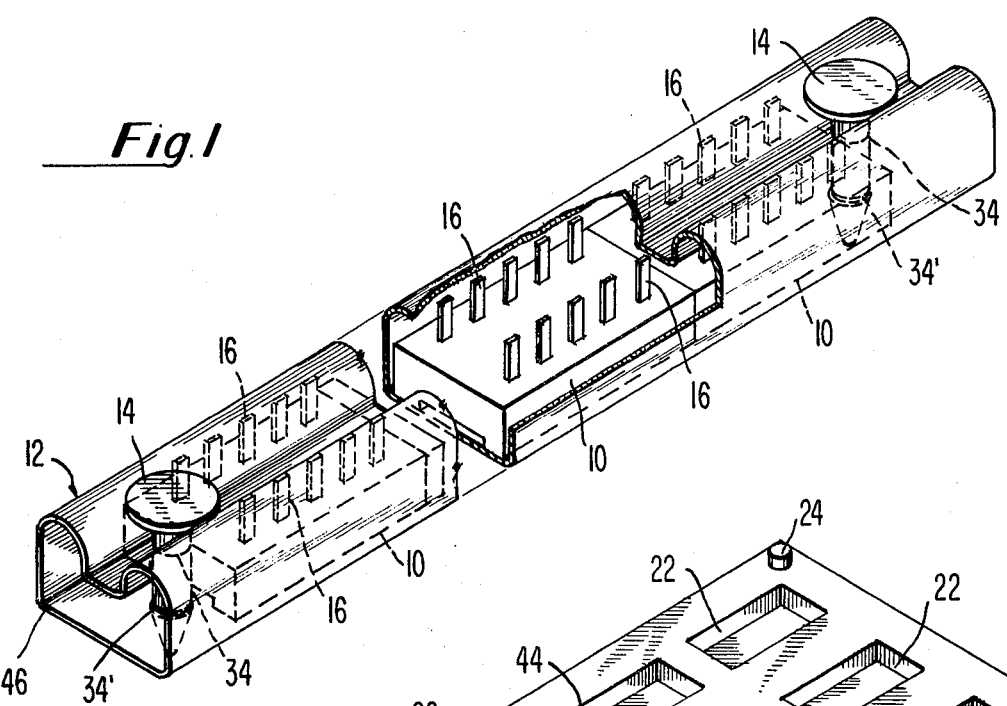
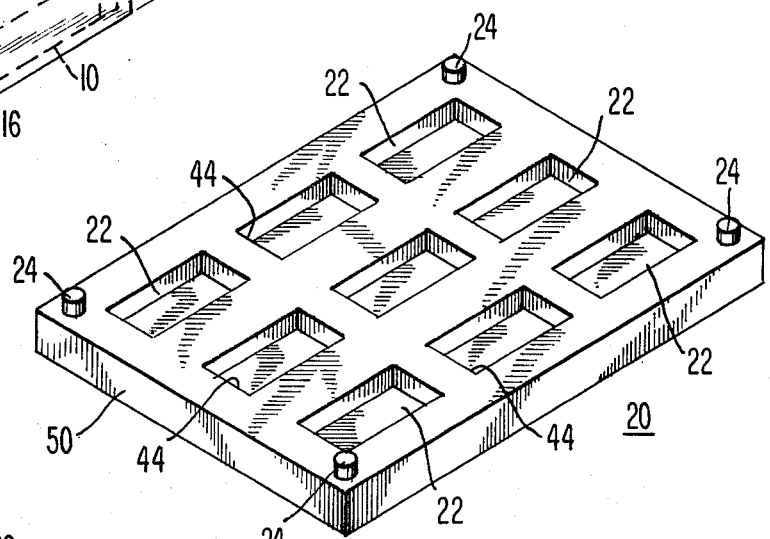
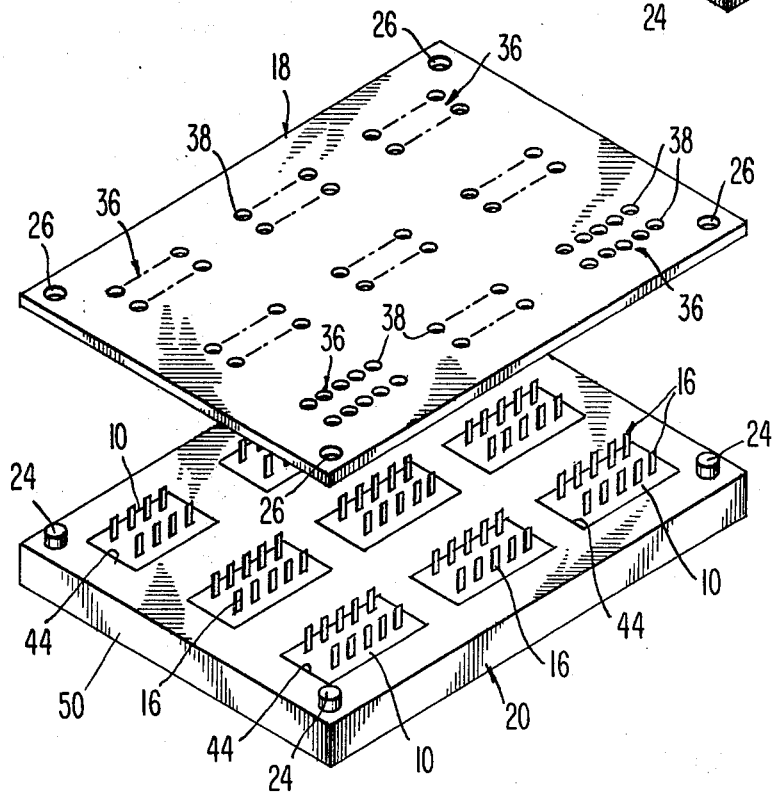

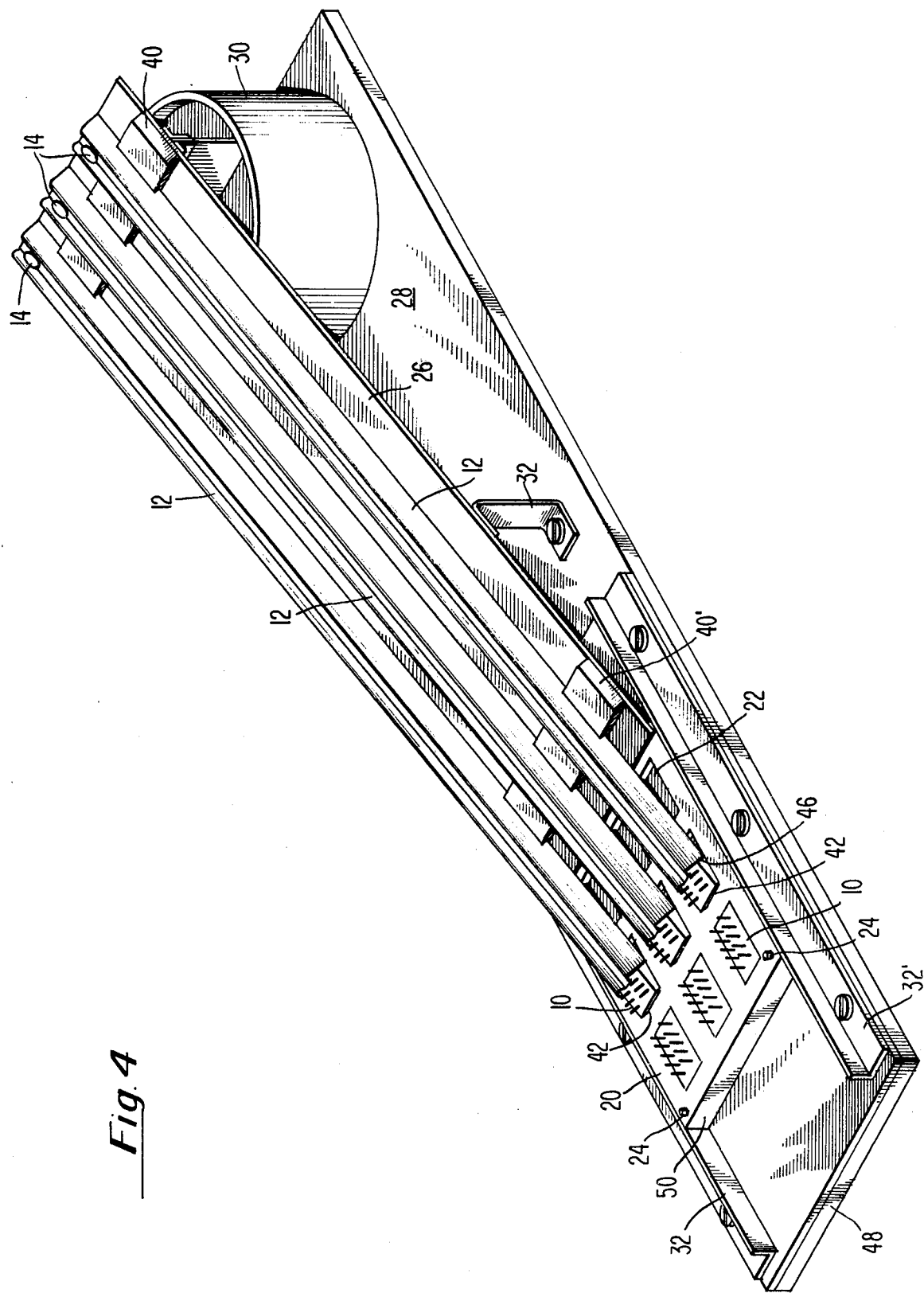

IC SOCKET INSERTION TOOL

CROSS REFERENCE TO RELATED APPLICATION

Reference is hereby made to a U.S. patent application entitled Apparatus and Method for Inserting Solder Preforms on Selected Circuit Board Back Plane Pins, Ser. No. 886,768, by Kenneth Vaughn Knuth et al., filed Mar. 15, 1978, now issued as U.S. Pat. No. 4,142,286 and assigned to the same assignee as the present application.

BACKGROUND OF THE INVENTION

This invention relates in general to an apparatus and method for inserting integrated circuit sockets on printed circuit boards.

Integrated circuits are often electrically connected to signal and voltage planes of a printed circuit (PC) board by means of integrated circuit (IC) sockets. In such case, the IC sockets are mounted on the PC board with the socket pins passing through corresponding holes drilled perpendicularly through the horizontal plane of the PC board. The socket pins are then soldered to voltage or signal planes within the PC board. The integrated circuits may then be plugged into the sockets to electrically connect them with the PC board's signal or voltage planes. This method of connecting integrated circuits to a PC board enables the user to rapidly replace integrated circuits without the need of desoldering the integrated circuit to be replaced and resoldering the replacement IC.

In the prior art, IC sockets were often mounted on the PC board manually by an operator. This method has several disadvantages. First, it is time consuming since the operator must align each socket to be mounted with the corresponding holes drilled in the PC board. Second, the sockets may be damaged if the operator does not correctly align the socket pins with the corresponding holes before pressing the socket into position.

It is a general object of the present invention to eliminate these and other drawbacks of the prior art by providing an apparatus and method which speeds up the process of inserting IC sockets on a PC board.

It is another object of the present invention to provide an apparatus for simultaneously inserting a plurality of IC sockets on a PC board.

It is a further object of the present invention to provide an apparatus for inserting IC sockets on a PC board that is particularly well suited to inserting the same pattern of IC sockets on a large number of identical printed circuit boards.

These and other objects, features and advantages of the present invention will become more apparent from the detailed description of the preferred embodiment when read in conjunction with the drawings.

SUMMARY OF THE INVENTION

According to the invention, a template is provided which has a pattern of rectangular parallelepiped cavities corresponding to the locations at which IC sockets are to be mounted on a printed circuit board, the size of the cavities corresponding to the length and width of the IC sockets. With the template loaded with IC sockets, pin side up, a printed circuit board, drilled with a pattern of holes corresponding to the pattern of IC socket pins, may be horizontally aligned above the template and brought into contact with the template such that the IC socket pins pass perpendicularly through the corresponding holes in the printed circuit board. The template/PC board may then be rotated 180 degrees and the template removed, leaving the IC sockets inserted on the PC board.

In order to load the template with IC sockets, the present invention provides a frame supported at an acute angle on which dispenser tubes, preloaded with IC sockets, may be attached. A vibration motor, positioned at the raised end of the frame, applies vibrations to the frame, causing the IC sockets to slowly move down the dispenser tubes. The template is slidably mounted at the lower end of the frame such that the open ends of the dispenser tubes may be positioned above each row of template cavities. As the IC sockets, pin side up, are discharged from the dispenser tubes, they fall into the row of cavities positioned below the open ends of the dispenser tubes. The operator then slides the template to position the next empty row of template cavities below the lower ends of the dispenser tubes. The latter step is repeated until the template is fully populated with IC sockets, at which time the loaded template is removed from the apparatus and aligned with a PC board as explained above.

BRIEF DESCRIPTION OF THE DRAWINGS

FIG. 1 is a pictorial view of a dispenser tube loaded with integrated circuit sockets.

FIG. 2 is a pictorial view of a printed circuit board positioned above a loaded template.

FIG. 3 is a pictorial view of an empty template.

FIG. 4 is a pictorial view of the apparatus of the present invention.

DETAILED DESCRIPTION OF THE PREFERRED EMBODIMENT

Referring now to FIG. 1, there is shown a pictorial view of a DIP-type integrated circuit (IC) socket 10 such as that typically used to electrically connect integrated circuits to a printed circuit (PC) board. A number of IC socket manufacturers, such as Berg Electronics, utilize a plastic dispensing tube 12 to protect the IC sockets 10 against damage during shipping. Typically, the IC sockets 10 are prevented from coming out the ends of the dispensing tube 12 by two pins 14, each of which passes through two holes 34,34' at the two ends of the dispensing tube 12, respectively. When it is desired to remove a socket 10 from the dispensing tube 12, one of the pins 14 is removed and an IC socket 10 will slide out of the tube 12 as it is tilted.

Referring now to FIG. 2, a typical printed circuit board 18 is shown. The circuit board is drilled with patterns 36 of holes 38 corresponding to the pattern of an IC socket's pins 16 such that an IC socket 10 may be mounted at each pattern 36 on the surface of the PC board 18 with its pins 16 passing perpendicularly through the corresponding holes 38 in the PC board 18. In typical use, after the IC sockets 10 are mounted on the PC board 18 the socket's pins 16 are soldered to the electrical plane of the PC board 18, using methods well known in the prior art.

Referring to FIG. 3, a template 20, as used in the preferred embodiment of the present invention, is shown. The template 20 surface contains a number of rectangular parallelepiped cavities 22, the number of cavities 22 corresponding to the number of IC sockets 10 to be mounted on the PC board 18. The length and width of each cavity 22 is at least equal to the corresponding external dimensions of an IC socket 10. The depth of the cavities 22 is preferably chosen so that when an IC socket 10, pin side up, is inserted in a cavity 22, the pins 16 will extend above the upper surface of the template 20, as shown in FIG. 2.

The template 20 includes four alignment pins 24 which are utilized to align the PC board 18 above the template 20 utilizing the corresponding alignment holes 26 in PC board 18. The positions of the cavities 22 in the template 20 are chosen so that when the template 20 is loaded with IC sockets 10, as shown in FIG. 2, the position of the pins 16 of each IC socket 10 will be in perpendicular alignment with the corresponding pattern of holes 36 drilled through the PC board 18. Once the lower surface of PC board 18 has been aligned above and lowered into contact with the upper surface of template 20, the template 20 and PC board 18 may be rotated 180 degrees. The template 20 may then be lifted vertically off the PC board 18, leaving the IC sockets 10 inserted on the PC board with their pins 16 passing perpendicularly through the corresponding holes 38 in the PC board 18. The IC socket pins 16 may then be soldered to the electrical plane of the PC board 18 using wave soldering techniques or other methods well known in the prior art. Details of an alternate means for accomplishing the alignment and rotation of the PC board 18 and the template 24 are disclosed in U.S. Pat. No. 4,142,286.

The present invention provides means for inserting the IC sockets 10 in the template 20, in preparation for installing the IC sockets 10 on the PC board 18, as previously described.

Referring now to FIG. 4, the preferred embodiment of the present invention is shown. A rigid frame 26 is positioned at an acute angle with respect to horizontal support 28 by means of vibration motor 30 and legs 32, 32' (not shown). Dispenser tubes 12, loaded with IC sockets 10, are mounted on frame 26 as shown. The ends of the dispenser tubes 12 are held in position on the frame 26 by press fitting them into the corresponding slots in alignment members 40, 40'. The retaining pins 14 are removed from the lower end 46 of each dispenser tube 12 to permit the sockets 10 to be discharged from the lower ends 46 of the dispenser tubes 12.

The distance between the opposed inner surfaces of angle iron legs 32, 32' is chosen to be equal to the width of template 20 such that template 20 may slide between the inner surfaces of legs 32, 32'. As shown in FIG. 4, with the dispenser tubes 12 mounted on frame 26, the bottom of the lower end 46 of each dispenser tube 12 is in slidable contact with the upper surface of template 20. The dispenser tubes 12 are positioned on frame 26 such that the lower ends 46 of the dispenser tubes 12 are in alignment with the corresponding cavities 22 in template 20 as the template 20 is slid between legs 32, 32'.

The angle that frame 26 is positioned at with respect to horizontal support 28 is chosen so that when vibration motor 30 is activated, the vibrations applied to frame 26 will cause the IC sockets 10 to slowly migrate toward the lower ends 46 of dispenser tubes 12 until the IC sockets 10 are discharged from the lower ends 46 of the dispenser tubes 12.

In operation, an empty template 20 is positioned, cavity 22 side up, between legs 32, 32' with the lower ends 46 of dispenser tubes 12 positioned over a row of cavities 22. The vibration motor 30 is then activated and the IC sockets 10 slowly migrate down the dispenser tubes 12. As the lower end 42 of the sockets 10 are discharged from the lower ends 46 of the dispenser tubes 12, the end 42 of each partially discharged IC socket 10 falls into a corresponding cavity 22, as shown in FIG. 4. The vibrational force imparted on the dispenser tubes 12 causes the partially discharged IC sockets 10 to migrate towards the ends 44 of cavities 22 and thus the ends 42 of the partially discharged IC sockets 10 are moved against the ends 44 of the corresponding cavities 22. At this point, the position of the end 42 of the partially discharged sockets 10 against the end 44 of the corresponding cavities 22 prevents the partially discharged IC sockets 10 from being fully discharged from the dispenser tubes 12, as shown in FIG. 4. As the operator slowly slides the template 20 toward the end 48 of horizontal support 28, the vibrational force causes the partially discharged IC sockets 10 to fully discharge from the corresponding dispenser tubes 12 and fully seat in the corresponding cavities 22.

Next the operator must slide the template 20 toward the end 48 of horizontal support 28 to position the next row of vacant cavities 22 in position to receive IC sockets 10 from dispenser tubes 12. Note that at this time vibration motor 30 is still on and hence IC sockets 10 are still migrating down the dispenser tubes 12. In the preferred embodiment of the present invention, the operator is provided with a flat plate (not shown) which can be positioned over the lower ends of the dispenser tubes 12 to block the discharge of IC sockets until the template 20 has been slid to position the next row of empty cavities 22 below the lower ends of corresponding dispenser tubes 12. When the template 20 has been properly positioned, the plate is removed and the IC sockets 10 discharge into the vacant cavities 22, as described previously. An alternate means of preventing discharge of IC sockets 10 while the operator is repositioning the template 20 is to turn off vibration motor 30 while repositioning template 20, thus stopping the IC sockets from descending down the dispenser tubes 12. Other alternate means will be obvious to those skilled in the art.

In operation, the row of cavities 22 closest to the end 50 of template 20 is the first row of cavities 22 to be populated with IC sockets 10 since the pins 16 of the IC sockets 10 extend perpendicularly above the upper surface of template 20 and movement of the template away from the end 48 of support 28 would be blocked by the ends 46 of the dispenser tubes 12.

Once all rows of cavities are populated with IC sockets 10, the template 20 is slid out of the apparatus. A PC board 18 is then aligned above and brought into contact with the template 20, and the sandwiched template 20/PC board 18 combination is rotated 180 degrees. The template 20 is then removed, leaving the IC sockets 10 installed on the PC board 18.

Having shown and described the preferred embodiment of the present invention, those skilled in the art will realize that various omissions, substitutions and changes in forms and details of the apparatus illustrated and its operation may be made without departing from the spirit of the invention. It is the intention, therefore, to be limited only as indicated by the scope of the following claims.

I claim:

1. An apparatus for use in mounting leaded electronic parts on a printed circuit board, said printed circuit board drilled with a plurality of holes to receive the mounting leads of said leaded electronic parts, said holes forming a plurality of patterns, each of said patterns corresponding to the pattern of the mounting leads of one of said leaded electronic parts, said printed circuit board further drilled with a plurality of alignment holes, said apparatus comprising:

- template means having a plurality of recesses, said template means for receiving said leaded electronic parts, each of said recesses located at a position corresponding to the location of one of said plurality of patterns on said printed circuit board; and
- means for positioning one of said leaded electronic parts in each of said recesses, whereby one of said leaded electronic parts is seated in each of said recesses, said positioning means including
- a horizontal support,
- means for dispensing said leaded electronic parts, said dispensing means including a plurality of dispensing tubes and means for holding said plurality of dispensing tubes in a position to dispense one of said leaded electronic parts into each of a subset of said plurality of said recesses,
- means connected to said horizontal support and said dispensing means, including means for supporting said dispensing means above and at an acute angle with said horizontal support, said support means further including means for vibrating said dispensing means, and
- alignment means connected to said horizontal support for aligning said template means in position to receive said leaded electronic parts, said alignment means including two angle iron shaped guide bars, said template means being slidable between the opposed inner surfaces of said guide bars.

2. The apparatus in accordance with claim 1 wherein each of said plurality of recesses is characterized as having a depth which is less than the height of each of said leaded electronic parts.

3. The apparatus in accordance with claim 2 wherein each of said plurality of recesses is further characterized as having a length and width at least equal to the corresponding dimensions of one of said leaded electronic parts.

4. The apparatus in accordance with claim 1 wherein each of said plurality of recesses is further characterized as having a rectangular parallelepiped shape.

5. The apparatus in accordance with claim 1 or 2 or 3 wherein said dispensing tube holding positioning means includes:

- a flat plate; and
- at least one slotted alignment member connected to said flat plate, said alignment member characterized by a plurality of slots into which said plurality of dispensing tubes is press fitted.

6. The apparatus in accordance with claim 5 wherein said template means further includes a plurality of alignment pins for aligning said printed circuit board above said template means in position to receive the mounting leads of said leaded electronic parts.

7. The apparatus in accordance with claim 5 wherein each of said dispensing tubes further includes removable means for preventing said leaded electronic parts from sliding out of said dispensing tube prior to mounting said dispensing tubes in said holding means.

8. An apparatus for use in mounting leaded electronic parts on a printed circuit board, said printed circuit board drilled with a plurality of holes to receive the mounting leads of said leaded electronic parts, said holes forming a plurality of patterns, each of said patterns corresponding to the pattern of the mounting leads of one of said leaded electronic parts, said printed circuit board further drilled with a plurality of alignment holes, said apparatus comprising:

- template means having a plurality of recesses, each of said recesses located at a position corresponding to the location of one of said plurality of patterns on said printed circuit board; and
- means for positioning one of said leaded electronic parts in each of said recesses, said positioning means including
- means for dispensing said leaded electronic parts, said dispensing means supported above and at an acute angle with respect to a horizontal plane, and
- alignment means, positioned on said horizontal plane below said dispensing means, said alignment means including at least one guide bar, said template means being slidable along said guide bar, said alignment means for aligning said template means in position to receive said leaded electronic parts.

9. The apparatus in accordance with claim 8 wherein said dispensing means includes:

- a plurality of dispensing tubes; and
- means for holding said plurality of dispensing tubes in a position to dispense one of said leaded electronic parts into each of a subset of said plurality of recesses.

10. The apparatus in accordance with claim 9 wherein said dispensing means further includes means for vibrating said dispensing means, said vibrating means for urging said electronic leaded parts to slide down said plurality of dispensing tubes.

11. The apparatus in accordance with claim 10 wherein said alignment means is characterized as including two angle iron shaped guide bars, said template means being slidable between the opposed inner surfaces of said guide bars.

12. The apparatus in accordance with claim 11 wherein each of said recesses is characterized as having a length and width at least equal to the corresponding dimensions of one of said electronic leaded parts and a depth which is less than the height of each of said leaded electronic parts.

13. The apparatus in accordance with claim 10 wherein said holding means includes:

- a flat plate; and
- at least one slotted alignment member connected to said flat plate, said alignment member characterized by a plurality of slots into which said plurality of dispensing tubes is press fitted.

* * * * *